United States Patent Office 3,677,756
Patented July 18, 1972

3,677,756

METHOD OF DRY POWDER ETCHING

Thomas F. Protzman, Worthington, Ohio, assignor to A. E. Staley Manufacturing Company, Decatur, Ill.

No Drawing. Filed Sept. 21, 1970, Ser. No. 74,122
Int. Cl. G03c 5/00
U.S. Cl. 96—36 14 Claims

ABSTRACT OF THE DISCLOSURE

The process for etching an etchable layer without a resist comprising the steps of exposing an etchable layer bearing a light-sensitive layer capable of receiving a powder in image-wise configuration to actinic radiation to form a latent powder-receptive image; developing said latent image with superficially dry etchant particles to form a layer of etchant particles in image-wise configuration; removing etchant particles from the non-image areas of said light-sensitive layer, and carrying out said etching reaction in a predetermined configuration conforming to the image-wise configuration of the superficially dry etchant particles.

This invention relates to a method of etching. More particularly, this invention relates to a method of etching without using a resist wherein a solid etchant is deposited in image-wise configuration on an etchable layer and said layer is etched with said etchant.

Etching processes are commonly used to produce various types of reliefs, such as those employed in the production of deep etch printing plates, gravure cylinders, printed circuits, chemical milling, etc. In general, a photographic resist is deposited on the layer to be etched and the layer bearing the resist is placed in a suitable etchant bath or sprayed continuously with liquid etchant. The areas protected by the resist remain intact while the unprotected areas are etched. For example, a negative-acting, light-sensitive layer, such as a dichromated colloid, is deposited on a layer, exposed to actinic radiation to tan the exposed areas, the unexposed areas of the light-sensitive layer removed with a suitable solvent or dispersing agent and the layer bearing the tanned resist placed in a suitable etching bath. It is of course obvious that it would be desirable to avoid the use of etching baths and find a method of etching with superficially dry materials. For example, spot etching and correcting would be facilitated by omitting conventional resist techniques. Further, since most light-sensitive layers capable of forming etch resists are inherently negative-acting, it is usually necessary to employ a negative of the design or image to be reproduced on the predetermined layer.

The principal object of this invention is to provide a method of etching using a superficially dry etchant. A second object of this invention is to provide a method of etching without using an etch resist. A further object of this invention is to provide a method of etching suitable for use with positive-acting, light-sensitive layers. Other objects will appear hereinafter.

In the description that follows, the phrase "powder-receptive, solid, light-sensitive organic layer" is used to describe an organic layer which is capable of developing a predetermined contrast or reflection density ($R_d$) upon exposure to actinic light and embedment of black powder particles of a predetermined size in a single stratum at the surface of said organic layer. While explained in greater detail below, the $R_d$ of a light-sensitive layer is a photometric measurement of the difference in degree of blackness of undeveloped areas and black powder developed areas. The terms "physically embedded" or "physical force" are used to indicate that the powder particle is subject to an external force other than, or in addition to, either electrostatic force or gravitational force resulting from dusting or sprinkling powder particles on a substrate. The terms "mechanically embedded" or "mechanical force" are used to indicate that the powder particle is subjected to a manual or machine force, such as lateral to-and-fro or circular rubbing or scrubbing action. The term "embedded" is used to indicate that the powder particle displaces at least a portion of the light-sensitive layer and is held in the depression so created, i.e. at least a portion of each particle is below the surface of the light-sensitive layer.

The objects of this invention can be attained by depositing a superficially dry solid etchant in image-wise configuration on an etchable layer and etching said layer with said etchant. In a preferred method of carrying out this invention, an etchable layer, bearing a light-sensitive layer capable of developing a $R_d$ of 0.2 to 2.2 (preferably a positive-acting, light-sensitive layer capable of developing a $R_d$ of 0.4 to 2.0) of the type described in commonly assigned application Ser. No. 796,847, filed Feb. 5, 1969, now U.S. Pat. 3,637,385, which is incorporated by reference, is exposed to actinic radiation to develop a potential $R_d$ of 0.2 to 2.2, said light-sensitive layer is developed with superficially dry powder particles comprising an etchant to embed said superficially dry powder particles as a monolayer into the surface of said light-sensitive layer in image-wise configuration, non-embedded solid particles are removed from said light-sensitive layer and the etching of said etchable layer is initiated. While various other methods of depositing superficially dry etchants can be employed the above method is preferred since it provides a method of carefully controlling the amount of etchant deposited on the surface of the etchable layer. For example, the amount of etchant delivered to any portion of the etchable layer can be carefully regulated by diluting the etchant with a suitable inert material or carrier or by regulating the particle size of the developing powder. Further, unlike other powder development processes, which are incapable of regulating the number of parts developer deposited per unit area, the preferred method of this invention is susceptible of very careful control since only a monolayer of developing powder is deposited in the light-sensitive layer. Accordingly, the amount of etchant delivered to the etchable layer can be carefully regulated.

Broadly speaking, the preferred method of depositing superficially dry etchants in image-wise configuration differs from other methods of forming powder images in various subtle and unobvious ways. For example, the powder particles are not merely dusted on, but instead are applied against the surface of the light-sensitive organic layer under moderate physical force after exposing the light-sensitive layer to actinic radiation. The relatively soft or particle-receptive nature of the light-sensitive layer is such that substantially a mono-layer of powder particles, or isolated small agglomerates of a predetermined size, are at least partially embedded at the surface of the light-sensitive layer by moderate physical force. The surface condition in the particle receptive area is at most only slightly soft but not fluid as in prior processes. The relatively hard or particle non-receptive condition of the light-sensitive surface in the non-image areas is such that when powder particles of a predetermined size are applied under the same moderate physical force few, if any, are embedded sufficiently to resist removal by moderate dislodging action such as blowing air against the surface. Any particles remaining in the non-image areas are removed readily by rubbing a soft pad over the surface.

The solid, light-sensitive organic layer, which can be an organic material in its naturally occurring or manufactured form or a mixture of said organic material with plasticizers and/or photoactivators for adjusting the powder receptivity and sensitivity to actinic radiation, are capable of developing a predetermined contrast or $R_d$ using a suitable black developing powder under the conditions of development. The powder-receptive areas of the layer (unexposed areas of a positive-acting, light-sensitive material or the exposed areas of a negative-acting, light-sensitive material) have a softness such that suitable particles can be embedded into a stratum at the surface of the light-sensitive layer by mild physical forces. However, the layer should be sufficiently hard that film transparencies can be pressed against the surface without the surfaces sticking together or being damaged even when heated slightly under high intensity light irradiation. The film should also have a degree of toughness so that it maintains its integrity during development. If the $R_d$ of the light-sensitive layer is below about 0.2, the light-sensitive layer is too hard to accept a suitable concentration of powder particles. On the other hand, if the $R_d$ is above about 2.2, the light-sensitive layer is so soft that it is difficult to maintain film integrity during physical development and the layer tends to adhere to transparencies precluding the use of vacuum frame or contact exposure equipment. Further, if the $R_d$ is above 2.2, the light-sensitive layer is so soft that more than one layer of powder particles may be deposited with attendant loss of image fidelity (and control of the etching reaction) and the layer may be displaced by mechanical forces resulting in distortion or destruction of the image. Accordingly, for use in this invention the light-sensitive layers are capable of developing a $R_d$ within the range of 0.2 to 2.2 or preferably 0.4 to 2.0, using a suitable black developing powder under the conditions of development.

The $R_d$ of a positive-acting, light-sensitive layer, which is called $R_{dp}$, is a photometric measurement of the reflection density of a black powder developed light-sensitive layer after a positive-acting, light-sensitive layer has been exposed to sufficient actinic radiation to convert the exposed areas into a substantially powder-non-receptive state (clear the background). The $R_d$ of a negative-acting, light-sensitive layer, which is called $R_{dn}$, is a photometric measurement of the reflection density of a black powder developed area, after a negative-acting, light-sensitive layer has been exposed to sufficient actinic radiation to convert the exposed area into a powder-receptive area.

In somewhat greater detail, the reflection density of a solid, positive-acting, light-sensitive layer ($R_{dp}$) is determined by coating the light-sensitive layer on a white substrate, exposing the light-sensitive layer to sufficient actinic radiation image-wise to clear the background of the solid positive-acting, light-sensitive layer, applying a black powder (prepared from 77% Pliolite VTL and 23% Neo Spectra carbon black in the manner described below) to the exposed layer, physically embedding said black powder under the conditions of development as a monolayer in a stratum at the surface of said light-sensitive layer and removing the non-embedded particles from said light-sensitive layer. The developed organic layer containing black powder embedded image areas and substantially powder free non-image areas is placed in a standard photometer having a scale reading from 0 to 100% reflection of incident light or an equivalent density scale, such as on Model 500 A photometer of the Photovolt Corporation. The instrument is zeroed (0 density; 100% reflectance) on a powder free non-image area of the light-sensitive organic layer and an average $R_d$ reading is determined from the powder developed area. The reflection density is a measure of the degree of blackness of the developed surface which is relatable to the concentration of particles per unit area. The reflection density of a solid, negative-acting light-sensitive layer ($R_{dn}$) is determined in the same manner except that the negative-acting, light-sensitive layer is exposed to sufficient actinic radiation to convert the exposed area into a powder receptive area. If the $R_d$ under the conditions of development is between 0.2 (63.1% reflectance) and 2.2 (0.63% reflectance), or preferably between 0.4 (39.8% reflectance) and 2.0 (1.0% reflectance), the solid, light-sensitive organic material deposited in a layer is suitable for use in this invention.

Although the $R_d$ of light-sensitive layers is determined by using the aforesaid black developing powder and a white substrate, the $R_d$ is only a measure of the suitability of a light-sensitive layer for use in depositing a monolayer of superficially dry etchant powder.

Since the $R_d$ of any light-sensitive layer is dependent on numerous factors other than the chemical constitution of the light-sensitive layer, the light-sensitive layer is best defined in terms of its $R_d$ under the development conditions of intended use. The positive-acting, solid, light-senstive organic layers useful in this invention must be powder receptive in the sense that the aforesaid black developing powder can be embedded as a monoparticle layer into a stratum at the surface of the unexposed layer to yield a $R_{dp}$ of 0.2 to 2.2 (0.4 to 2.0 preferably) under the predetermined conditions of development and light-sensitive in the sense that upon exposure to actinic radiation the most exposed areas can be converted into the non-particle receptive state (background cleared) under the predetermined conditions of development. In other words, the positive-acting, light-sensitive layer must contain a certain inherent powder receptivity and light-sensitivity. The positive-acting, light-sensitive layers are apparently converted into the powder-non-receptive state by a light-catalyzed hardening action, such as photopolymerization, photocrosslinking, photooxidation, etc. Some of these photohardening reactions are dependent on the presence of oxygen, such as the photooxidation of internally ethylenically unsaturated acids and esters while others are inhibited by the presence of oxygen, such as those based on the photopolymerization of vinylidene or polyvinylidene monomers alone or together with polymeric materials. The latter requires special precautions, such as storage in oxygen-free atmosphere or oxygen-impermeable cover sheets. For this reason, it is preferable to use solid, positive-acting, film-forming, organic materials containing no terminal ethylenic unsaturation.

The negative-acting, solid, light-sensitive organic layers useful in this invention must be light-sensitive in the sense that, upon exposure to actinic radiation, the most exposed areas of the light-sensitive layer are converted from a non-powder-receptive state under the predetermined conditions of development to a powder-receptive state under the predetermined conditions of development. In other words, the negative-acting, light-sensitive layer must have a certain minimum light-senstivity and potential powder receptivity. The negative-acting, light-sensitive layers are apparently converted into the powder-receptive state by a light-catalyzed softening action, such as photodepolymerization, photoisomerization, etc.

In general, the positive-acting, solid, light-sensitive layers useful in this invention comprise a film-forming organic material in its naturally occurring or manufactured form or a mixture of said organic material with plasticizers and/or photoactivators for adjusting powder receptivity and sensitivity to actinic radiation. Suitable positive-acting, film-forming organic materials, which are not inhibited by oxygen, include internally unsaturated acids, such as abietic acid, rosin acids, partially hydrogenated rosin acids, such as those sold under the name Staybelite resin, wood rosin, etc., esters of internally ethylenically unsaturated acids, methylol amides of maleated oils such as described in U.S. Pat. 3,471,466, phosphatides of the class described in application Ser. No. 796,841 filed on Feb. 5, 1969, now U.S. Pat. 3,585,031, in the name of Hayes, such as soybean lecithin,, partially hydrogenated lecithin, dilinolenyl-alpha-lecithin, etc., partially hydrogenated rosin acid esters, such as those sold under the name Staybelite esters, rosin modified alkyds, etc.; polymers of ethylenically unsaturated monomers, such as vinyltoluene-alpha methyl styrene copolymers, polyvinyl cinnamate, polyethyl methacrylate, vinyl acetate-vinyl stearate copolymers, polyvinyl pyrrolidone, etc.; coal tar resins such as coumarone-indene resins, etc.; halogenated hydrocarbons, such as chlorinated waxes, chlorinated polyethylene, etc. Positive-acting, light-sensitive materials, which are inhibited by oxygen include mixtures of polymers, such as polyethylene terephthalate/sebacate, or cellulose acetate or acetate/butyrate, with polyunsaturated vinylidene monomers, such as ethylene glycol diacrylate or dimethacrylate, tetraethylene glycol diacrylate or dimethylacrylate, etc.

Although numerous positive-acting, film-forming organic materials have the requisite light-sensitivity and powder-receptivity at predetermined development temperatures, it is generally preferably to compound the film-forming organic material with photoactivator(s) and/or plasticizer(s) to impart optimum powder receptivity and light-sensitivity to the light-sensitive layer. In most cases, the light-sensitivity of an element can be increased many fold by incorporation of a suitable photoactivator capable of producing free-radicals, which catalyze the light-sensitive reaction and reduce the amount of photons necessary to yield the desired physical change.

Suitable photoactivators capable of producing free-radicals include benzil, benzoin, Michlers ketone, diacetyl, phenanthraquinone, p-dimethylaminobenzoin, 7,8-benzoflavone, trinitrofluorenone, desoxybenzoin, 2,3-pentanedione, dibenzylketone, nitroisatin, di(6-dimethylamino-3-pyradil)methane, metal naphthanates, N-methyl-N-phenylbenzylamine, pyridil, 5,7-dichloroisatin, azodiisobutyronitrile, trinitroanisole, chlorophyll, isatin, bromoisatin, etc. These compounds can be used in a concentration of .001 to 2 times the weight of the film-forming organic material (.1%–200% the weight of film former). As in most catalytic systems, the best photoactivator and optimum concentration thereof is dependent upon the film-forming organic material. Some photoactivators respond better with one type of film former and may be useful with substantially all film-formers in wide concentration ranges.

The acyloin and vicinal diketone photoactivators, particularly benzil and benzoin are preferred. Benzoin and benzil are effective over wide concentration ranges with substantially all film-forming light-sensitive organic materials. Benzoin and benzil have the additional advantage that they have a plasticizing or softening effect on film-forming light-sensitive layers, thereby increasing the powder receptivity of the light-sensitive layers. When employed as a photoactivator, benzil should preferably comprise at least 1% by weight of the film-forming organic material (.01 times the film former weight).

Dyes, optical brighteners and light absorbers can be used alone or preferably in conjunction with the aforesaid free-radical producing photoactivators (primary photoactivators) to increase the light-sensitivity of the light-sensitive layers of this invention by converting light rays into light rays of longer lengths. For convenience, these secondary photoactivators (dyes, optical brighteners and light absorbers) are called "superphotoactivators." Suitable dyes, optical brighteners and light absorbers include 4-methyl-7-dimethylaminocoumarin, Calcofluor yellow HEB (preparation described in U.S. Pat. 2,415,373), Calcofluor white SB super 30080, Calcofluor, Uvitex W conc., Uvitex TXS conc., Uvitex RS (described in Textil-Rundschau 8 [1953], 339), Uvitex WGS conc., Uvitex K, Uvitex CF conc., Uvitex W (described in Textil-Rundschau 8, [1953], 340), Aclarat 8678, Blancophor OS, Tenopol UNPL, MDAC S–8844, Uvinul 400, Thilflavin TGN conc., Aniline yellow-S (low conc.), Seto flavine T 5506–140, Auramine O, Calcozine yellow OX, Calcofluor RW, Calcofluor GAC, Acetosol yellow 2 RLS–PHF, Eosine bluish, Chinoline yellow-P conc., Ceniline yellow S (high conc.), Anthracene blue Violet fluorescence, Calcofluor white MR, Tenopol PCR, Uvitex GS, Acid-yellow-T-supra, Acetosol yellow 5 GLS, Calcocid OR. Y. Ex. Conc., diphenyl brilliant flavine 7 GFF, Resoflorm fluorescent yellow 3 GPI, Eosin yellowish, Thiazole fluorescor G, Pyrazalone organe YB–3, and National FD&C yellow. Individual superphotoactivators may respond better with one type of light-sensitive organic film-former and photoactivator than with others. Further, some photoactivators function better with certain classes of brighteners, dyes and light absorbers. For the most part, the most advantageous combinations of these materials and proportions can be determined by simple experimentation.

As indicated above, plasticizers can be used to impart optimum powder receptivity to the light-sensitive layer. With the exception of lecithin, most of the film-forming light-sensitive organic materials useful in this invention are not powder-receptive at room temperature but are powder-receptive above room temperature. Accordingly, it is desirable to add sufficient plasticizer to impart room temperature (15 to 30° C.) or ambient temperature powder receptivity to the light-sensitive layers and/or broaden the $R_{dp}$ range of the light-sensitive layers.

While various softening agents, such as dimethyl siloxanes, dimethyl phthalate, glycerol, vegetable oils, etc. can be used as plasticizers, benzil and benzoin are preferred since, as pointed out above, these materials have the additional advantage that they increase the light-sensitivity of the film-forming organic material. As plasticizer-photoactivators, benzoin and benzil are preferably used in a concentration of 1% to 80% by weight of film-forming solid organic material.

The preferred positive-acting, light-sensitive film formers containing no conjugated terminal ethylenic unsaturation include the esters and acids of internally ethylenically unsaturated acids, particularly the phosphatides, rosin acids, partially hydrogenated rosin acids and the partially hydrogenated rosin esters. These materials, when compounded with suitable photoactivators, preferably acyloins or vicinal diketones together with superphotoactivators, require less than 2 minutes exposure to clear the background of light-sensitive layers.

In general, the negative-acting, light-sensitive layers useful in this invention comprise a film-forming organic material in its naturally occurring or manufactured form, or a mixture of said organic material with plasticizers and/or photoactivators for adjusting powder receptivity and sensitivity to actinic radiation. Suitable negative-acting, film-forming organic materials include n-benzyl linoleamide, dilinoleyl-alpha-lecithin, castor wax (glycerol 12-hydroxystearate), ethylene glycol monohydroxy stearate, polyisobutylene, polyvinyl stearate, etc. Of these, castor wax and other hydrogenated ricinoleic acid esters (hydroxystearate) are preferred. These materials can be compounded with plasticizers and/or photoactivators in the same manner as the positive-acting, light-sensitive film-forming organic materials.

Some solid, light-sensitive organic film formers can be used to prepare either positive or negative-acting, light-sensitive layers. For example, a poly(n-butyl methacrylate) layer containing 20 percent benzoin (20 parts by weight benzoin per 100 parts by weight polymer) yields good positive-acting images. Increasing the benzoin level to 100 percent converts the poly(n-butyl methacrylate) layer into a good negative-acting system.

The light-sensitive layers are formed by applying a thin layer of solid, light-sensitive film-forming organic material having a potential $R_d$ of 0.2 to 2.2 (i.e. capable of developing a $R_{dp}$ or $R_{dn}$ of 0.2 to 2.2) to the etchable layer by any suitable means dictated by the nature of the film-forming organic material and/or the etchable layer (hot-melt, draw down, spray, roller coating or air knife, flow, dip or whirler coating, curtain coating, etc.) so as to produce a reasonably smooth, homogeneous layer of from 0.1 to 40 microns thick employing suitable solvents, as necessary. The particular method of application of the light-sensitive layer depends in part upon the chemical nature of the etchable layer since the light-sensitive layer must be deposited without destroying the continuity of the etchable layer. For the most part, it is desirable to apply the light-sensitive film-forming organic material from a non-solvent for the etchable layer or by laminating a preformed light-sensitive layer to said etchable layer. If desired, a temporary or semi-permeable isolating layer can be used to separate the light-senstive layer from the etchable layer.

The etchable layer, which functions as a substrate for the light-sensitive layer, should be relatively smooth and uniform in order to facilitate obtaining a smooth light-sensitive layer. The etchable layer, which can be opaque or transparent, can be made up of a homogeneous single layer or can be a multilayer structure. Suitable etchable layers include organic films, such as those produced from animal proteins, such as gelatin, glue and casein or vegetable proteins, such as soybeans, pea, bean, corn, cotton seed and potato, starches which may be native starches, modified starches or low DS (degree of substitution) starches such as native corn starch, tapioca starch, rice starch, waxy corn starch, potato starch, wheat starch, amylose and amylopectin starch infractions, starches partially modified by treatment with enzymes, hypochlorites or acid, derivatives such as starch acetates, carboxymethyl starch, hydroxyethyl starch, hydroxypropyl starch, etc. Suitable etchable metallic layers include aluminum, copper, mild steel, zinc, etc. If desired, non-metallic etchable layers, such as glass, porcelain, plastic, etc. can be employed.

As indicated above, any of these etchable layers may comprise the exterior layer of a multi-layer structure. For example, the etchable layer can be laminated to substrates, such as steel, chrome and aluminum plates, foils, glass, paper, cellulose esters (cellulose acetate, cellulose propionate, cellulose butyrate, etc.), surface hydrolyzed cellulose acetate, regenerated cellulose, polyethylene terephthalate, nylon, polystyrene, polyethylene, polypropylene, corona discharge treated polyethylene and polypropylene, Tedler PVF (polyvinyl fluoride), polysiloxanes, etc., polyvinyl alcohol, amylose, ceramic materials, etc. In most cases the components of the multilayer element will be dictated by its end use. For example, aluminized polyethylene terephthalate (Mylar) can be employed to produce reflective images for projection viewing.

The light-sensitive layer must be at least 0.1 micron thick and preferably at least 0.4 micron in order to hold suitable powders during development. If the light-sensitive layer is less than 0.1 micron, or the developing powder diameter is more than 25 times layer thickness, the light-sensitive layer does not hold the etchant powder with the necessary tenacity. In general, as layer thickness increases, the light-sensitive layer is capable of holding larger particles. However, as the light-sensitive layer thickness increases, it becomes increasingly difficult to maintain film integrity during film development and subsequent transport of the active ingredient or ingredients in the etchant to the etchable layer. Accordingly, the light-sensitive layer must be from 0.1 to 40 microns, preferably from 0.4 to 10 microns, with 0.5 to 2.5 microns being best.

The preferred method of applying light-sensitive layers of predetermined thicknesses to the etchable layer comprises flow coating a solution in an organic solvent vehicle (hydrocarbons, such as hexane, heptane, benzene, etc.; halogenated hydrocarbons, such as chloroform, carbon tetrachloride, 1,1,1 - trichloroethane, trichloroethylene, etc.; alcohols, such as ethanol, methanol, isopropanol, etc.; ketones, such as acetone, methyl ethylketone, etc.) of the light-sensitive organic film-former alone or together with dissolved or suspended photoactivators or plasticizers onto the etchable layer. The hydrocarbons and halohydrocarbons, which are excellent solvents for the preferred positive-acting, light-sensitive film formers, containing no terminal conjugated ethylenic unsaturation, are the preferred vehicles because of their high volatility and low cost. Typically, solutions prepared with these vehicles can be applied to the etchable layer and air dried to a continuous clear film in less than one minute. In general, the halohydrocarbons have the advantage that they are non-flammable and can be used without danger of flash fires. However, many of these, such as chloroform and carbon tetrachloride must be handled with care due to the toxicity of their vapors. Of all these solvents, 1,1,1-trichloroethane is preferred since it has low toxicity, is non-flammable, low cost and has high volatility. In general, the thickness of the light-sensitive layer can be varied as a function of the concentration of the solids dissolved in the solvent vehicle.

After the etchable layer is coated with a suitable solid, light-sensitive organic layer, a latent image is formed by exposing the element to actinic radiation in image-receiving manner for a time sufficient to provide a potential $R_d$ of 0.2 to 2.2 (clear the background of the positive-acting, light-sensitive layer or establish a potential $R_{dn}$ of 0.2 to 2.2 with negative-acting, light-sensitive layers) the light-sensitive elements can be exposed to actinic radiation through a photographic positive or negative, which may be line, half-tone or continuous tone.

As indicated above, the latent images are preferably produced from positive-acting, light-sensitive layers by exposing the element in image receiving manner for a time sufficient to clear the background, i.e. render the exposed areas non-powder-receptive. As explained in commonly assigned application Ser. No. 796,847, now U.S. Pat. No. 3,637,385, the amount of actinic radiation necessary to clear the background varies to some extent with developer powder size and development conditions. Due to these variations it is often desirable to slightly overexpose line and half-tone images in order to assure complete clearing of the background. Slightly more care is necessary in producing continuous-tone powder images since overexposure tends to decrease the tonal range of the developed image. In general, overexposure is preferred with negative-acting, light-sensitive elements in order to provide maximum contrast.

After the light-sensitive element is exposed to actinic radiation for a time sufficient to clear the background of a positive-acting, light-sensitive layer or establish a potential $R_{dn}$ of 0.2 to 2.2, a suitable superficially dry developing powder having a diameter or dimension along one axis of at least 0.3 micron is applied physically with a suitable force, preferably mechanically, to embed the powder in the light-sensitive layer. The developing powder can be virtually any shape, such as spherical, acicular, platelets, etc.

The superficially dry etchant can be applied in a substantially pure form, if a solid at development temperature, or on a suitable carrier. However, the carriers must be substantially inert with respect to the etchant employed. Carriers, such as resinous or polymeric materials, clays (Bentonite), inert oxides (silica, titanium dioxide), etc., can be employed to regulate the concentration of the etchant to be applied, or in the case of a liquid etchant, permit the application of the liquid etchant to the light-sensitive layer in superficially dry powder form. The etchant, if solid, can be ball-milled with carrier in order to coat the carrier with etchant or, if desired, blended above the melting point of fusible or resinous carriers, ground to a suitable size and classified. In general, liquid etchants can be absorbed on the surface of a suitable solid carrier or encapsulated in suitable carrier. In some cases, it is advantageous to dissolve carrier and etchant (solid or liquid) in a mutual solvent, dry and grind to suitable size. The superficially dry etchant powder can contain from about 0.1 to 100% by weight etchant and correspondingly 99.9 to 0% by weight carrier.

The black developing powder for determining the $R_d$ of a light-sensitive layer is formed by heating about 77% Pliolite VTL (vinyltoluene-butadiene copolymer) and 23% Neo Spectra carbon black at a temperature above the melting point of the resinous carrier, blending on a rubber mill and then grinding in a Mikro-atomizer. Commercially available powders, such as Xerox 914 Toner, give substantially similar results although tending toward slightly lower $R_d$ values.

Suitable active etchants include acids, such as hydrochloric acid, acetic acid, citric acid, tartaric acid, oxalic acid, etc.; acidic metal salts such as ferric chloride, cupric chloride, cadmium chloride, magnesium chloride, zinc chloride, ferric nitrate, etc.; strong bases, such as sodium hydroxide, potassium hydroxide; oxidizing agents, such as sodium persulfate, sodium perborate; potassium bichromate, sodium peroxide, etc. To a large extent the particular etchant or etchants employed are dependent upon the layer to be etched and the carrier or means employed to dispense the etchant. For example, liquid etchants of the type described above must be applied in either encapsulated form or on a suitable carrier. On the other hand, solid etchants, such as acidic metal salts or superficially dry bases, can be deposited in powder form or dissolved in a suitable solvent and either applied on a carrier or encapsulated for subsequent activation.

The developing powders useful in this invention contain particles having a diameter or dimension along at least one axis of from about 0.3 to 40 microns, preferably from 0.5 to 15 microns with powders of the order of 1 to 7 microns being best for light-sensitive layers of 0.4 to 10 microns. Maximum particle size is dependent on the thickness of the light-sensitive layer while minimum particle size is independent of layer thickness. Electron microscope studies have shown that developing powders having a diameter 25 times the thickness of the light-sensitive layer cannot be permanently embedded in light-sensitive layers, and generally speaking, best results are obtained where the diameter of the powder particle is less than about 10 times the thickness of the light-sensitive layer. For the most part, particles over 40 microns are not detrimental to image development provided the developing powder contains a reasonable concentration of powder particles under 40 microns, which are less than 25 times, and preferably less than 10 times, the light-sensitive layer thickness. However, other things being equal, the larger the developer powder particles (above 10 microns), the lower the $R_d$ of the developed image. For example, when Xerox 914 Toner, classified to contain (a) all particles under 1 micron, (b) 1 to 3 micron particles, (c) 3 to 10 micron particles, (d) 10 to 18 microns and (e) all particles over 18 microns, was used to develop positivve-acting 1 micron thick lecithin light-sensitive elements after the same exposure, the images had a $R_{dp}$ of (a) 0.83, (b) 0.95, (c) 0.97, (d) 0.32 and (e) 0.24, respectively.

Although particles over 40 microns are not detrimental to image development, the presence of particles under 0.3 micron diameter along all axes can be detrimental to proper image formation. In general, it is preferable to employ developing powders having substantially all powders having a diameter along at least one axis not less than 0.3 micron, preferably more than 0.5 micron, since particles less than 0.3 micron tend to embed in non-image areas.

As the particle size of the smallest particles increases, less exposure to actinic radiation is required to clear the background. For example, when Xerox 914 Toner, classified to contain (a) all particles under 1 micron, (b) 1 to 3 micron particles, (c) 3 to 10 micron particles, (d) 10 to 18 micron particles and (e) over 18 micron particles, was used to develop the light-exposed portions of positive-acting 1 micron thick lecithin light-sensitive elements, the exposed portions had a $R_{dp}$ of (a) 0.26, (b) 0.23, (c) 0.10, (d) 0 and (e) 0 after equal exposures. By suitably increasing the exposure time, the $R_{dp}$ of the non-image areas was reduced to substantially zero with particles (a), (b) and (c). Other things being equal, the larger particle size of the developing powder used in this invention, the higher the concentration of etchant subsequently delivered to the etchable layer after powder development.

In somewhat greater detail, the developing powder is applied directly to the light-sensitive layer, while the powder receptive areas of said layer are in at most only a slightly soft condition and said layer is at a temperature below the melting point of the layer and powder. The powder is distributed over the area to be developed and physically embedded into the stratum at the surface of the light-sensitive layer, preferably mechanically by force having a lateral component, such as to-and-fro and/or circular rubbing or scrubbing action using a soft pad, fine brush or even an inflated balloon. If desired, the powder may be applied separately or contained in the pad or brush. The quantity of powder is not critical provided there is an excess available beyond that required for full development of the area, as the development seems to depend primarily on particle-to-particle interaction rather than brush-to-surface or pad-to-surface forces to embed a layer of powder particles substantially one particle thick (monoparticle layer) into a stratum at the surface of the light-sensitive layer. Only a single stratum of powder particles penetrates into the powder-receptive areas of the light-sensitive layer even if the light-sensitive layer is several times thicker than the developer particle diameter. This, of course, makes it possible to carefully control the concentration of etchant delivered to the etchable layer. Where a multilayer of etchant powder is employed, as in the less preferred techniques described below, it is more difficult to control the concentration of etchant applied and the dimensions of the etched product.

The pad or brush used for development is critical only to the extent that it should not be so stiff as to scratch or scar the film surface when used with moderate pressure with the preferred amount of powder to develop the film. Ordinary absorbent cotton loosely compressed into a pad about the size of a baseball and weighing about 3 to 6 grams is especially suitable. The developing motion and force applied to the pad during development is not critical. The speed of the swabbing action is not critical other than that it affects the time required; rapid movement requiring less time than slow. The preferred mechanical action involved is essentially the lateral action applied in ultrafine finishing of a wood surface by hand sanding or steel wooling.

Hand swabbing is entirely satisfactory, and when performed under the conditions described above, will reproducibly produce the maximum density which the material is capable of achieving. That is, the maximum concentration of particles per unit area will be deposited under the prescribed conditions, dependent upon the physical properties of the material such as softness, resiliency, plasticity, and cohesivity. Substantially the same results can be achieved using a mechanical device for the powder application. A rotating or rotating and oscillating, cylindrical brush or pad may be used to provide the described brushing action and will produce a substantially similar end result.

After the application of developing powder, excess etchant remains on the surface which has not been sufficiently embedded into, or attached to, the layer. This may be removed in any convenient way, as by wiping with a clean pad or brush usually using somewhat more force than employed in mechanical development, by vacuuming, by vibrating, or by air doctoring and recovered. For simplicity and uniformity of results, the excess powder usually is blown off using an air gun having an air-line pressure of about 20 to 40 p.s.i. The gun is preferably held at an angle of about 30 to 60 degrees to the surface at a distance of 1 to 12 inches (3 to 8 preferred). The pressure at which the air impinges on the surface is about 0.1 to 3, and preferably about 0.25 to 2, pounds per square inch. Air cleaning may be applied for several seconds or more until no additional loosely held particles are removed. The remaining etchant powder should be sufficiently adherent to resist removal by moderately forceful wiping or other reasonably abrasive action.

Various other methods of photochemically depositing superficially dry solid etchant in image-wise configuration on an etchable layer can be employed. However, as explained above, these techniques have the disadvantage that it is markedly more difficult to control the amount of etchant deposited on the surface of the etchable layer. For example, it is virtually impossible to regulate the number of parts developer deposited per unit area because these various other techniques tend to deposit a multi-layer. Further, some of these processes, such as those based upon the use of xerographic developing powders, are seriously limited by the chemical and physical properties necessary in the formulation of a suitable Xerographic developing powder and in the development techniques for their use.

Suitable other methods of photochemically depositing superficially dry solid etchant in image-wise configuration on an etchable layer include employing a solid, light-sensitive layer of the type described in application Ser. No. 796,847, now U.S. Pat. 3,637,385, and developing under conditions where said standard developer yields a $R_d$ of over 2.2 in which case a multi-layer of powder particles may be deposited. Alternatively, superficially dry etchant powders can be deposited using the photodimerizable light-sensitive compounds of British specification 1,152,368, the photoisomerizable light-sensitive compounds of U.S. Pat. 3,487,764, the negative-acting photoisomerizable light-sensitive compounds of U.S. Pat. 3,450,531, the negative-acting or positive-acting, light-sensitive acetals of U.S. Pat. 2,090,450, the positive-acting photopolymerizable compositions of British specification 987,903 and U.S. Pat. 3,060,024, etc., the disclosures of which are hereby incorporated by reference. It is of course within the scope of this invention to modify any of the aforesaid light-sensitive compositions using the principles of Ser. No., 796,847, now U.S. Pat. 3,637,385, to deposit only a monolayer of superficially dry etchant powder. As indicated, it is also possible to employ Xerographic or electrostatic light-sensitive elements and developing powders comprising superficially dry etchant or encapsulated liquid etchants.

In all of these processes for etching an etchable layer without a resist, the process comprises the steps of exposing an etchable layer bearing a light-sensitive layer capable of receiving a powder in image-wise configuration to actinic radiation to form a latent powder-receptive image; developing said latent image with superficially dry etchant particles to form a layer of etchant particles in image-wise configuration; removing etchant particles from the non-image areas of said light-sensitive layer; and carrying out said etching reaction in a predetermined configuration conforming to the image-wise configuration of the superficially dry etchant particles.

In substantially all of these processes, after the etchant in the non-image areas is removed from the surface of the light-sensitive element, the etchable layer is separated from the etchant particles by the light-sensitive subbing layer. In order to initiate and carry out said etching reaction, the etchant must be brought into reactive contact with the etchable layer. This can be accomplished in several ways, such as by transporting the etchant through the light-sensitive layer, by fracturing the light-sensitive layer and transporting the etchant into contact with the etchable layer by diffusion, etc. For example, the element can be treated with vapors of a material, which is a solvent for the etchant and diffused through the light-sensitive layer into contact with the etchable layer. Typically, this can be accomplished by employing vapors of a solvent, such as water, hydrocarbons (hexane, heptane, pentane, etc.), halohydrocarbons (trichloroethylene, 1,1,1-trichloroethane, etc.), alcohols (methanol, ethanol, isopropanol, etc.), ketones (acetone, methyl ethyl ketone, etc.), etc. Alternatively, the element can be heated to a suitable temperature to alter the barrier properties of the light-sensitive layer and bring the etchant into contact with said etchable layer or application of pressure may force the etchant through the light-sensitive layer.

In some cases, etching is initiated as soon as the etchant comes into contact with the etchable layer. In other cases, it may be necessary to provide a reactive environment for the etchant, such as an ionizing medium (water) for acidic metallic salts. Likewise, it may be desirable to heat the resultant element to a suitable temperature to initiate or speed up the etching. It is of course possible to transfer the superficially dry etchant from the surface of the light-sensitive layer, such as is common in xerographic processes or by stratum transfer, to a receiving layer composed of said etchable layer. In this case the superficially dry solid etchant is in direct contact with the etchable layer and no light-sensitive layer is interposed between the etchant particles. The etching reaction can then be initiated by treating with a suitable solvent, heating, or in the case of encapsulated liquid etchant, by merely breaking the capsule to release the etchant.

After the etching reaction is completed, the original light-sensitive layer and any residual carrier for the etchant remaining on the surface of the light-sensitive layer, are removed from the surface of the etched layer. Preferably, the degradation products, etchants used to form the degradation products and light-sensitive layer are removed with an appropriate solvent and/or removed mechanically, such as by abrasion. In this way, usefully defined image areas are formed which can be utilized for forming various types of printing plates, printed circuits, gravure cylinders, etc. This process is particularly useful for the preparation of transparent photographic elements of the type utilized in copending application Ser. No. 74,120 filed on even date.

The following examples are merely illustrative and should not be construed as limiting the scope of this invention.

EXAMPLE I

This example illustrates the preparation of a transparent photographic element suitable for use in projection imaging. The aluminum side of an aluminized Mylar (polyethylene terephthalate) element was flow coated with a solution comprising .64 gram Staybelite Ester #10 (partially hydrogenated rosin ester of glycerol), .16 gram benzil and .096 gram 4-methyl-7-dimethylaminocoumarin, dissolved in 100 mls. Chlorothene (1,1,1-trichloroethane), to form a 1 micron light-sensitive layer. The sensitized side of the element was placed in contact with a positive transparency and exposed to actinic radiation in a vacuum frame for about one minute. The unexposed areas were developed with a sodium hydroxide developing powder, prepared by grinding equal parts by weight sodium hydroxide and micronized Piccolastic D–150 (styrene polymer) with a mortar and pestle. The sodium hydroxide powder was embedded into the unexposed areas of the light-sensitive Staybelite layer by rubbing a wad of cotton over the surface of the element using essentially the same force as employed in the ultrafine finishing of wood. After the non-embedded sodium hydroxide developing powder was removed from the surface of the light-sensitive element, the embedded sodium hydroxide was activated by holding the element over a steam bath. After a short time, the element was washed with water to remove the sodium hydroxide developing powder and aluminate degradation products from the element. The areas, which had been developed with sodium hydroxide developing powder, were free of any aluminum coating, while the areas which had originally been exposed to light and not developed with sodium hydroxide, retained their aluminized coating. By placing the element in a projector equipped with a high intensity light source, it was possible to project an image corresponding to the discontinuous aluminum layer on a screen in room light.

Essentially the same results are obtained by replacing the Staybelite ester composition described above with (1) 1.25 grams Staybelite Ester #5 (partially hydrogenated rosin ester of glycerol), .1875 gram benzil and .3125 gram 4-methyl-7-dimethylaminocoumarin, dissolved in 100 mls. Chlorothene, (2) 1.25 grams of Staybelite resin F (partially hydrogenated rosin acids), .1 gram benzil and .3125 gram 4-methyl-7-dimethylaminocoumarin, dissolved in 100 ml. Chloroethene, (3) 1.25 grams wood rosin, .15 gram benzil and .3125 gram 4-methyl-7-dimethylaminocoumarin, dissolved in 100 mls. Chlorothene and (4) 1.25 grams abietic acid, .15 gram benzil and .3125 gram 4-methyl-7-dimethylaminocoumarin, dissolved in 100 mls. Chlorothene.

EXAMPLE II

Example I was repeated with essentially the same results except that a developing powder comprising 50% by weight ball-milled Piccolastic D–150 and cupric chloride was employed in place of the sodium hydroxide developing powder.

EXAMPLE III

Example I was repeated with essentially the same results except that the sodium hydroxide developing powder was replaced with a ball-milled developing powder comprising 50 parts by weight cadmium chloride and 50 parts by weight tartaric acid.

EXAMPLE IV

This example illustrates the preparation of a planographic printing plate suitable for use without an aqueous fountain solution of the type described in U.S. Pat. 3,511,-178. A surface hydrolyzed cellulose acetate plate is prepared by flow coating with a solution of 20 parts by weight of a silicone gum (a high molecular linear polysiloxane, such as commercially available "G.E. RTV 108") and 80 parts by weight of heptane, air drying the element and curing the polysiloxane to the surface hydrolyzed cellulose acetate layer by heating for about 5 to 10 minutes at 200° F., the polysiloxane side of the element is coated with a thin layer of aluminum by vacuum deposition, the aluminum side of the element flow-coated with a solution comprising .64 gram Staybelite Ester #10 (partially hydrogenated rosin acid ester of glycerol), .16 gram benzil and .096 gram 4-methyl-7-diethylaminocoumarine, dissolved in 100 mls. Chlorothene, placing the light-sensitive element in contact with a positive transparency, exposing the element to actinic radiation for about one minute, removing the transparency from the sensitized element and physically developing with the superficially dry sodium hydroxide developing powder employed in Example I, non-embedded etchant is removed with a clean wad of cotton, the element is placed over a steam bath to actuate the sodium hydroxide etchant, washed with water to remove the sodium hydroxide degradation products, dried and washed with Chlorothene to remove the Staybelite layer. The bare aluminum forms the ink receptive portion of the planographic printing plate while the bare polysiloxane surface forms the ink non-receptive surface.

EXAMPLE V

A negative polysaccharide relief is obtained by repeating Example I, using an underivatized amylose coated sheet of paper, using a 50 parts by weight ferric chloride-50 parts by weight Pliolite VTL developing powder, steaming the element to imbibe the ferric chloride into the amylose layer and washing the amylose layer with hot water to dissolve the digested amylose and remaining ferric chloride developing powder.

EXAMPLE VI

This example illustrates the preparation of a bimetallic planographic printing plate. Example I is repeated except that the copper side of a copper-aluminum bimetallic plate is sensitized with the Staybelite sensitizer used in Example I, developed with a developing powder comprising 50 parts by weight ferric nitrate and 50 parts by weight Pliolite VTL, steamed, washed out with water and the Staybelite ester layer removed with Chlorothene. The copper in the areas corresponding to the exposed Staybelite ester layer remain on the plate and constitute the oleophilic portion of the plate, while the bare aluminum constitutes the hydrophilic portions of the printing plate.

Since many embodiments of this invention may be made and since many changes may be made in the embodiments described, the foregoing is to be interpreted as illustrative only and my invention is defined by the claims appended hereafter.

What is claimed is:

1. The process of etching an etchable layer without using a resist which comprises:

(1) exposing to actinic radiation in image-receiving manner an etchable layer, bearing a light-sensitive layer capable of developing a $R_d$ of 0.2 to 2.2 to develop a potential $R_d$ of 0.2 to 2.2;

(2) applying to said layer of organic material free-flowing superficially dry etchant particles having a diameter along at least one axis of at least about 0.3 micron but less than 25 times the thickness of said light-sensitive layer;

(3) while the layer is at a temperature below the melting point of the superficially dry etchant powder and of the light-sensitive layer, physically embedding said powder particles as a monolayer in a stratum at the surface of said light-sensitive layer to yield an image having portions varying in density in proportion to the exposure of each portion;

(4) removing non-embedded particles from said layer to develop an image comprising a monolayer of said superficially dry etchant particles, and (5) carrying out said etching reaction in a predetermined configuration conforming to the image-wise configuration of the superficially dry etchant particles.

2. The process of claim 1, wherein said etching reaction is initiated by transporting the etchant through the light-sensitive layer.

3. The process of claim 1, wherein said etching reaction is initiated by fracturing the light-sensitive layer and transporting the etchant into contact with the etchable layer.

4. The process of claim 1, wherein superficially dry etchant particles comprise a carrier for said etchant.

5. The process of claim 1, wherein said etchable layer is metallic.

6. The process of claim 5, wherein said etchable metallic layer is aluminum.

7. The process of claim 6, wherein said etchable metallic layer comprises an aluminized polysiloxane.

8. The process of claim 5, wherein said etchable aluminum layer is on a transparent film base.

9. The process of claim 8, wherein said etchable aluminum layer on a transparent film base comprises aluminized polyethylene terephthalate.

10. The process of claim 1, wherein said light-sensitive organic material comprises a member selected from the group consisting of internally ethylenically unsaturated esters, internally ethylenically unsaturated acids, halogenated hydrocarbons and mixtures thereof.

11. The process of claim 10, wherein said organic material comprises a partially hydrogenated rosin acid.

12. The process of claim 10, wherein said organic material comprises a partially hydrogenated rosin ester.

13. The process of claim 10, wherein said organic material comprises a halogenated hydrocarbon.

14. The process of claim 1, wherein said organic material comprises a polymer of an ethylenically unsaturated monomer.

References Cited

UNITED STATES PATENTS

| | | | |
|---|---|---|---|
| 3,511,648 | 5/1970 | Garett | 96—36 |
| 3,516,346 | 6/1970 | Schaefer et al. | 96—36 |
| 3,520,686 | 7/1970 | Kopczewski et al. | 96—36 |
| 3,236,640 | 3/1966 | Tomaner et al. | 96—115 |
| 3,499,781 | 3/1970 | Krueckel | 96—115 |
| 3,060,026 | 10/1962 | Heiart | 96—28 |
| 3,236,647 | 3/1966 | Philpot | 96—34 |

NORMAN G. TORCHIN, Primary Examiner

E. C. KIMLIN, Assistant Examiner

U.S. Cl. X.R.

96—35.1, 28